(12) United States Patent
Yun

(10) Patent No.: US 8,102,017 B2
(45) Date of Patent: Jan. 24, 2012

(54) IMAGE SENSOR AND METHOD FOR MANUFACTURING THE SAME

(75) Inventor: Ki Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 313 days.

(21) Appl. No.: 12/341,864

(22) Filed: Dec. 22, 2008

(65) Prior Publication Data
US 2009/0166790 A1    Jul. 2, 2009

(30) Foreign Application Priority Data
Dec. 27, 2007   (KR) .................. 10-2007-0139391

(51) Int. Cl.
*H01L 27/146* (2006.01)
(52) U.S. Cl. ............. 257/448; 257/465; 257/E27.152; 438/60; 438/66
(58) Field of Classification Search ............ 257/431, 257/435, 444, 448, 465, E27.131, E27.152, 257/E23.07, E23.071, E23.151, E23.152; 438/60, 66, 71
See application file for complete search history.

(56) References Cited

U.S. PATENT DOCUMENTS

| | | | | |
|---|---|---|---|---|
| 5,656,543 A * | 8/1997 | Chung | ............. | 438/625 |
| 5,936,261 A | 8/1999 | Ma | | |
| 6,228,757 B1 * | 5/2001 | Sengupta et al. | ............. | 438/622 |
| 7,382,034 B2 * | 6/2008 | Rieve et al. | ............. | 257/443 |

FOREIGN PATENT DOCUMENTS

| | | |
|---|---|---|
| JP | 2000-156488 A1 | 6/2000 |
| KR | 10-2005-0117674 A | 12/2005 |

OTHER PUBLICATIONS

Shawming Ma and Jeremy A. Theil; "High-Performance Image Sensor Array"; Abstract for Patent Publication No. 2000-156488; Publication Date: Jun. 6, 2000; Japanese Patent Office; Japan.
Sang Yun Lee; "Image Sensor of Three-Dimensional Structure Using Depletion Region for Improving Yield and Manufacturing Method Thereof"; Abstract for Patent Publication No. 1020050117674 A; Publication Date: Dec. 15, 2005; Korean Intellectual Property Office; Republic of Korea.
Korean Office Action dated Mar. 4, 2008; Korean Patent Application No. 10-2007-0139390; Korean Intellectual Property Office, Republic of Korea.

* cited by examiner

*Primary Examiner* — Julio J Maldonado
(74) *Attorney, Agent, or Firm* — The Law Offices of Andrew D. Fortney; Andrew D. Fortney; Theresa J. Mahan

(57) ABSTRACT

An image sensor may comprise circuitry, a first lower electrode, a photodiode, an upper electrode, a second lower electrode, and an upper interconnection. The circuitry may comprise a first lower interconnection and a second lower interconnection over a dielectric of a substrate. The first lower electrode, the photodiode, and the upper electrode may be sequentially formed over the first lower interconnection. The second lower electrode may comprise a passivation layer over the second lower interconnection. The upper interconnection may be formed over the second lower electrode and electrically connected to the upper electrode.

19 Claims, 4 Drawing Sheets

IMAGE SENSOR AND METHOD FOR MANUFACTURING THE SAME

The present application claims under 35 U.S.C. §119 to Korean Patent Application No. 10-2007-0139391 (filed Dec. 27, 2007), which is hereby incorporated by reference in its entirety.

BACKGROUND

An image sensor is a semiconductor device for converting optical images into electric signals. Image sensors may be classified into charge coupled device (CCD) image sensors and complementary metal oxide silicon (CMOS) image sensors (CIS).

A CIS generally includes a photodiode and a MOS transistor within each unit pixel, and obtains an image by sequentially detecting electrical signals of unit pixels in a switching manner.

During the fabrication method of a CMOS image sensor in accordance with the related art, a process for forming a photodiode is followed by a chemical mechanical polishing (CMP) process for forming a multilayer structure including two or more metal interconnections and a dielectric.

However, the related art method may cause a decrease in photosensitivity due to an increase in the distance between a photodiode and a color filter, and result in an increase in bad pixels due to an increase in defects.

SUMMARY

Embodiments of the present invention relate to an image sensor and a manufacturing method thereof that can three dimensionally integrate an image chip, which may comprise forming a color filter array and a microlens after forming a photodiode using a second chip, and a logic chip, which may include a driver IC for driving the image chip and a logic array for providing other supplementary functions, by using one pad.

Therefore, since a plurality of metal lines may be omitted from an upper portion of a photodiode, a distance between the photodiode and a microlens may be reduced and the length of a light path may be reduced, thereby improving photosensitivity.

Embodiments of the present invention also relate to an ashing process used after patterning a photodiode and/or a microlens. In the case of Cr having high reactivity with $O_2$, Cr reacts with $O_2$ and thus is mostly lost during a process of removing photoresist (PR).

Inventions developed for preventing such a phenomenon generally use methods of removing PR through a wet process. However, in the case of the wet process, a process time is lengthy and it is difficult to remove PR efficiently. Furthermore, chemical(s) used in the wet process may react with Cr so that the thickness of Cr is greatly reduced. Also, an upper portion of the Cr metal may become contaminated with chemical(s) and thus sheet resistance (Rs) increases, thus degrading the performance of a device.

Embodiments of the present invention provide a structure of an image sensor which may be such that PR used for patterns after a Cr etching process can be removed using a dry ashing process, rather than a wet process. Thus, a process time can be reduced and a loss of Cr thickness and/or contamination can be reduced or eliminated, thus optimizing the performance of a device.

When PR used for patterns after a Cr etching process is removed using a dry ashing process, a sidewall which is not protected by oxide may react with oxygen and thus lose thickness. The loss region is protected using an oxide byproduct generated during the etching, so that PR over Cr can be removed with little or no loss.

According to embodiments of the present invention, an image sensor may comprise: circuitry over which a first lower interconnection and a second lower interconnection are formed on a dielectric on a substrate; a first lower electrode, a photodiode, and an upper electrode over the first lower interconnection; a second lower electrode including a passivation over the second lower interconnection; and an upper interconnection over the second lower electrode, the upper interconnection being electrically connected to the upper electrode.

According to further embodiments of the present invention, a method for manufacturing an image sensor may comprise: forming a circuitry including a first lower interconnection and a second lower interconnection over a dielectric of a substrate; sequentially forming a first lower electrode, a photodiode, and an upper electrode over the first lower interconnection; forming a second lower electrode including a passivation layer over the second lower interconnection; and forming an upper interconnection electrically connected to the upper electrode over the second lower electrode.

DRAWINGS

FIGS. 1 through 10 illustrate an exemplary image sensor and an exemplary method for manufacturing an image sensor in accordance with embodiments of the present invention.

DESCRIPTION

An image sensor and a method for manufacturing an image sensor in accordance with embodiments of the present invention will be described in detail with reference to the accompanying drawings.

In the description of embodiments, it will be understood that when a layer (or film) is referred to as being 'on' another layer or substrate, it can be directly on another layer or substrate, or one or more intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

FIG. 1A is a cross-sectional view of a logic region in which a lower interconnection and an upper interconnection are formed.

Figure 1A:
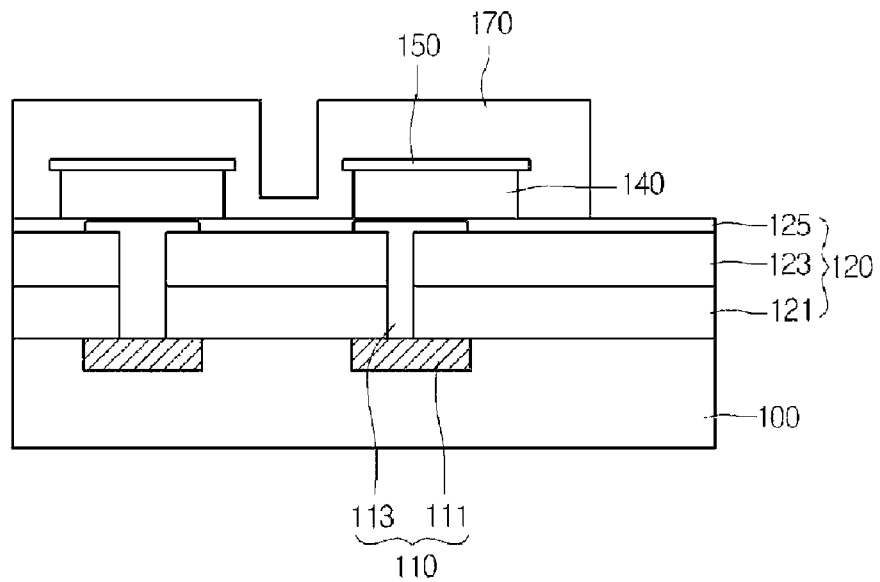
FIG. 1A is a sectional view of an exemplary image sensor in accordance with embodiments of the present invention.
Figure 1B:
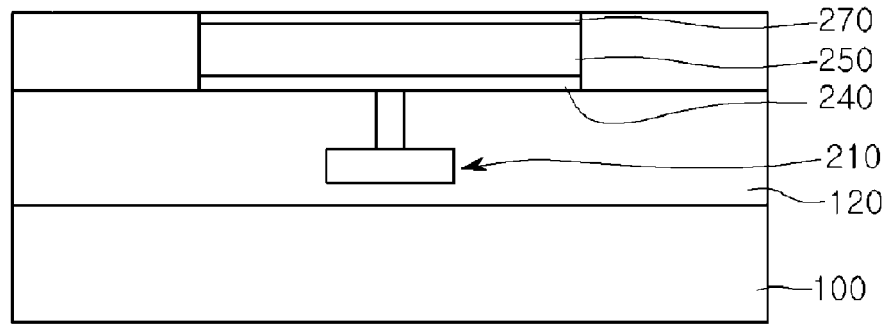
FIG. 1B is a sectional view of a pixel region in which photodiode 250 may be formed. The pixel region can be formed at a side of the logic region.

As illustrated in FIGS. 1A and 1B, an image sensor in accordance with embodiments of the present invention may comprise: circuitry (not shown) in which first lower interconnection 210 and second lower interconnection 110 are formed on and/or in dielectric 120 of substrate 100; first lower electrode 240 on first lower interconnection 210; photodiode 250 on first lower electrode 240; upper electrode 270 on photodiode 250; second lower electrode 140 including a passivation layer on second lower interconnection 110; and upper interconnection 170 on second lower electrode 140, upper interconnection 170 being electrically connected to upper electrode 270.

A protective insulating layer 150 can be formed on second lower electrode 140. In an image sensor in accordance with embodiments of the present invention, since second lower electrode 140 may be protected by protective insulating layer 150, second lower electrode 140, for example, profile of a Cr cathode, can be maintained. Thus, a contamination problem generated during a wet process can be solved or mitigated, process time can be significantly reduced, and thickness of Cr can be maintained, thereby improving electrical characteristics.

Furthermore, in accordance with embodiments of the present invention, the size of Cr can be controlled according to a predetermined or desired design rule by preventing loss of Cr in an oxygen plasma ashing process after etching of Cr. Moreover, due to the protection of Cr and prevention of loss, circuit direction of the cathode can be freely modified, and margin in manufacturing the circuit of a device can be significantly increased.

Hereinafter, an exemplary method for manufacturing an image sensor in accordance with embodiments of the present invention will be described with reference to FIGS. 2 to 7. FIGS. 2 to 7 are cross-sectional views of a logic region in which a lower interconnection and an upper interconnection may be formed.

Figure 2:
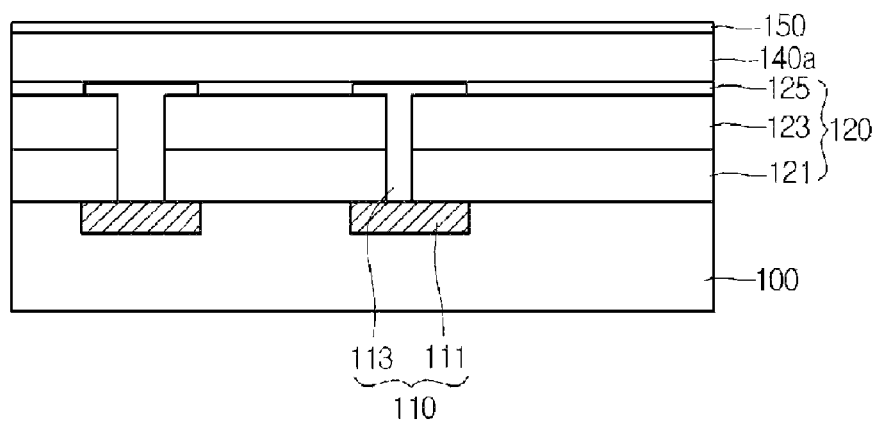

As illustrated in FIG. 1B and FIG. 2, a circuitry may comprise first lower interconnection 210 and second lower interconnection 110 on dielectric 120. First lower interconnection 210 can serve as passage for electrons generated from photodiode 250. Second lower interconnection 110 may comprise top metal 111 and plug 113 and can serve as a pad. Top metal 111 can be formed on and/or in substrate 100, and plug 113 can be formed on and/or in first dielectric 121, second dielectric 123, and third dielectric 125.

First lower electrode 240 can be formed on first lower interconnection 210, and photodiode 250 can be formed on first lower electrode 240. Upper electrode 270 can be formed on photodiode 250. First lower electrode 240 may comprise Cr, but is not limited thereto.

Hereinafter, a method for manufacturing photodiode 250 in accordance with embodiments of the present invention will be described with reference to example FIG. 1B. In some embodiments, photodiode 250 may be formed on an amorphous layer.

First, a first conduction type conduction layer may be formed on lower electrode 240. If necessary, a subsequent process may be performed without forming the first conduction type conduction layer. The first conduction type conduction layer may act as an N-layer of a PIN diode employed in embodiments of the present invention. That is, the first conduction type conduction layer may be, but is not limited to, an N-type conduction layer.

The first conduction type conduction layer may comprise n-doped amorphous silicon, but a process is not limited thereto. That is, the first conduction type conduction layer may comprise a-Si:H, a-SiGe:H, a-SiC, a-SiN:H, a-SiO:H or the like which may be formed by adding Ge, C, N, O or the like to amorphous silicon.

Next, an intrinsic layer may be formed on the first conduction type conduction layer. The intrinsic layer may act as an I-layer of the PIN diode employed in embodiments of the present invention. The intrinsic layer may comprise amorphous silicon. The intrinsic layer may be formed by CVD, in particular, PECVD. For example, the intrinsic layer may be formed by PECVD using silane ($SiH_4$) gas.

After that, a second conduction type conduction layer may be formed on the intrinsic layer. The second conduction type conduction layer and the intrinsic layer may be formed in-situ. The second conduction type conduction layer may act as a P-layer of the PIN diode employed in embodiments of the present invention. That is, the second conduction type conduction layer may be, but is not limited to, a P-type conduction layer.

The second conduction type conduction layer may comprise, but is not limited to, p-doped amorphous silicon. The second conduction type conduction layer may be formed by CVD, in particular, PECVD. For example, the second conduction type conduction layer may be formed by PECVD in which Boron (B) or the like is mixed with silane ($SiH_4$) gas.

Next, an upper electrode 270 may be formed on the second conduction type conduction layer. The upper electrode 270 may comprise a transparent electrode material having a high light transmission and a high conductivity. For example, upper electrode 270 may comprise indium tin oxide (ITO), cadmium tin oxide (CTO) or the like.

As illustrated in FIG. 2, metal layer 140a for the lower electrode may be formed on substrate 100 including second lower interconnection 110. Metal layer 140a for the lower electrode may comprise Cr, but is not limited thereto.

As illustrated in FIG. 2, protective insulating layer 150 may be formed on metal layer 140a for the lower electrode. Protective insulating layer 150 may comprise, but is not limited to, an oxide layer of about 550-1,500 Å.

Figure 3:
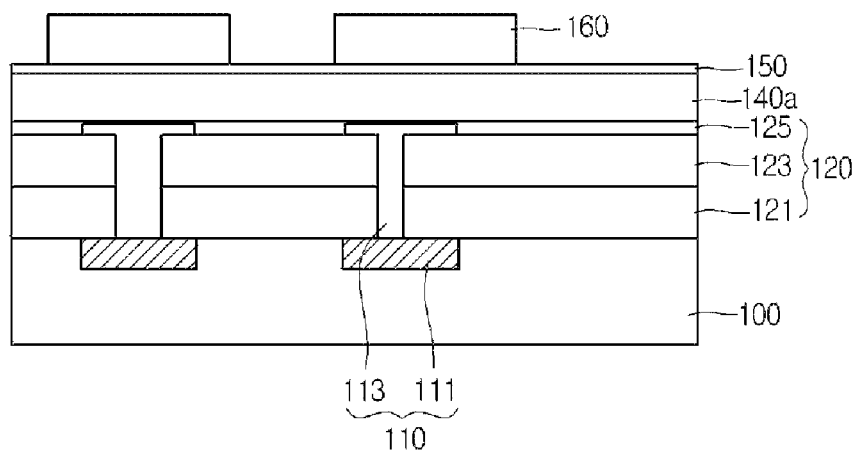

As illustrated in FIG. 3, mask pattern 160 for the lower electrode may be formed on protective insulation layer 150. Mask pattern 160 for the lower electrode may be formed by a PR process.

Figure 4:
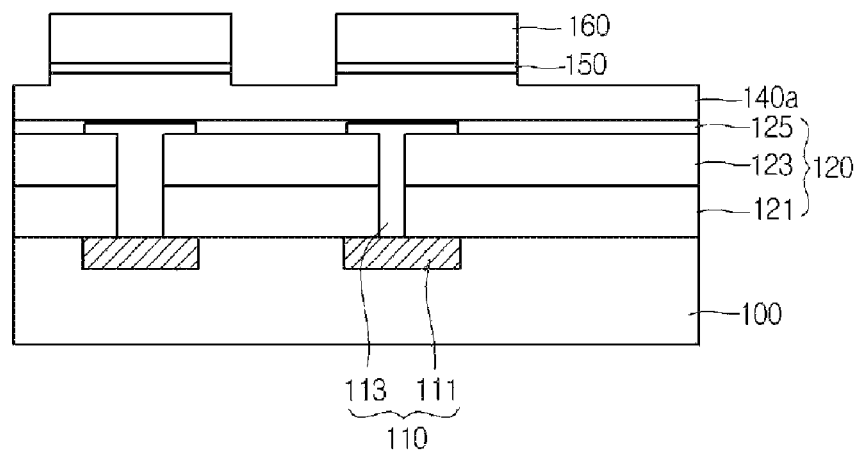

As illustrated in FIG. 4, protective insulating layer 150 may be selectively etched using mask pattern 160 for the lower electrode as a mask to leave protective insulating layer 150 over second lower interconnection 110. The etching of protective insulating layer 150 may be performed by dry etching, but is not limited thereto.

Figure 5:
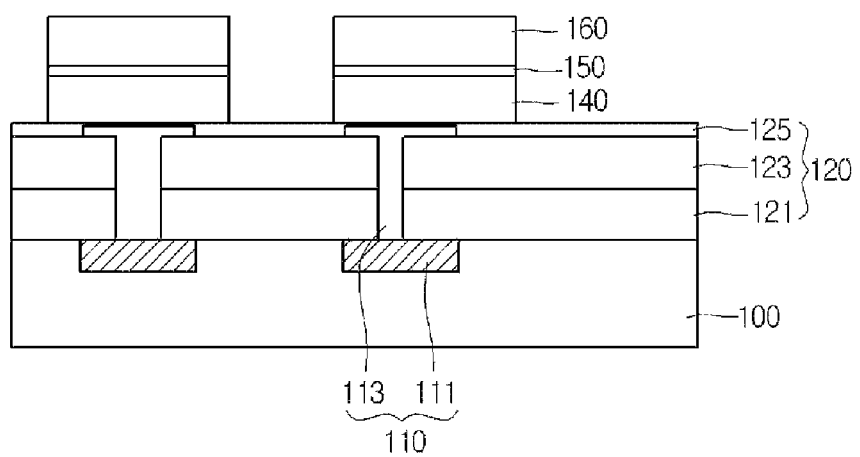

As illustrated in FIG. 5, metal layer 140a for the lower electrode may be etched using mask pattern 160 for the lower electrode as a mask to form second lower electrode 140. The etching of metal layer 140a for the lower electrode may be performed by dry etching, but is not limited thereto.

Figure 6:
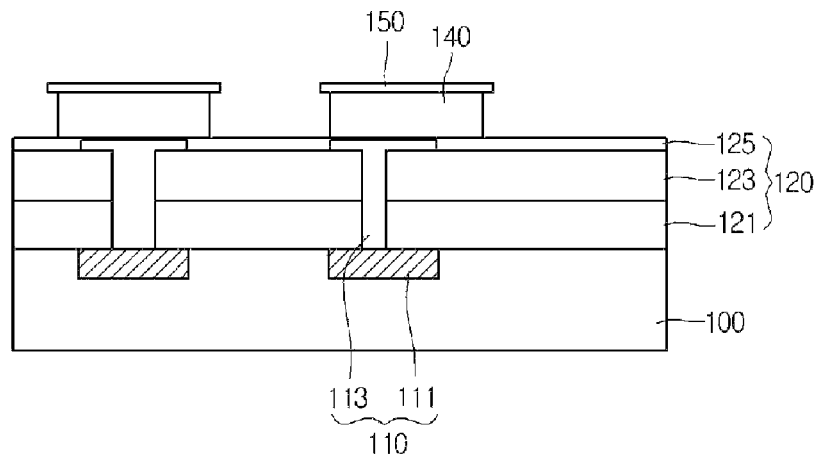

As illustrated in FIG. 6, mask pattern 160 for the lower electrode may be removed. PR remaining after the etching of Cr can be removed using an $O_2$ plasma ashing process.

Figure 7:
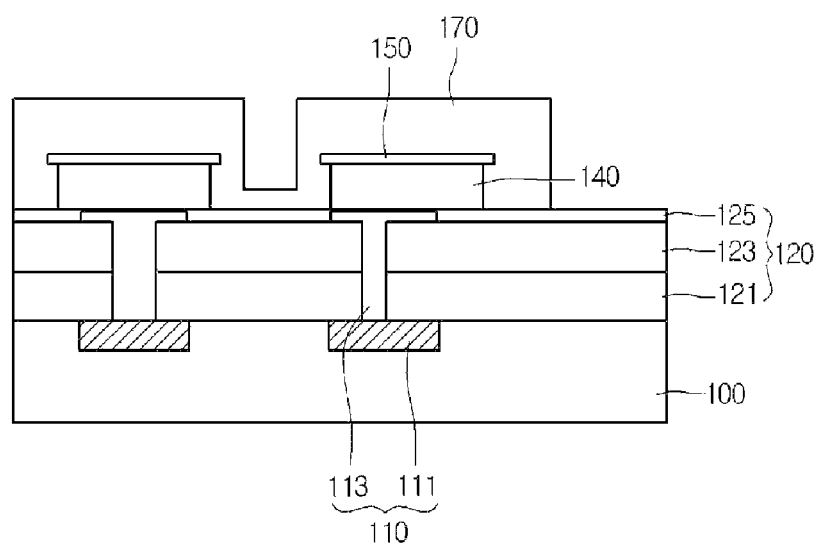

As illustrated in FIG. 7, upper interconnection 170 may be electrically connected to the upper electrode 270 and can be formed on and/or over second lower electrode 140. Upper interconnection 170 may comprise a dark metal to prevent light from being transmitted to the logic region. Upper interconnection 170 can be in contact with a side of second lower electrode 140.

In a method for manufacturing an image sensor in accordance with embodiments of the present invention, since the second lower electrode may be protected by the protective insulating layer, the second lower electrode, for example, profile of the Cr cathode, can be maintained. Thus, a contamination problem generated during the wet process can be solved or mitigated, processing time can be significantly reduced, and thickness of Cr can be maintained, thereby improving electrical characteristics.

Furthermore, in accordance with embodiments of the present invention, the size of Cr can be controlled according to a predetermined or desired design rule by preventing loss of Cr in an oxygen plasma ashing process after etching of Cr. Moreover, due to the protection of Cr and prevention of loss, circuit direction of the cathode can be freely modified, and margin in manufacturing the circuit of a device can be significantly increased.

Figure 8:
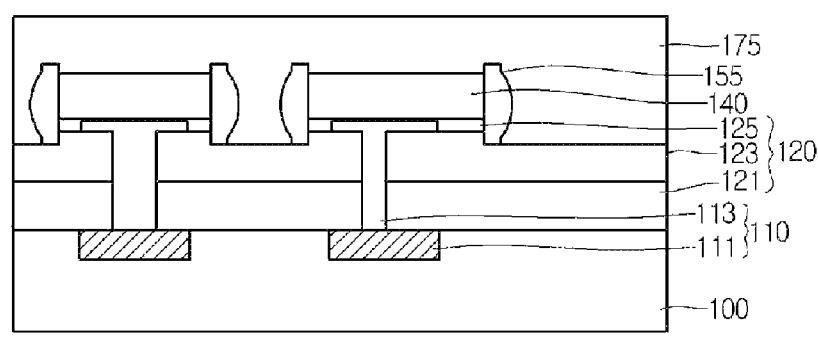

FIG. 8 is a sectional view of an exemplary image sensor in accordance with embodiments of the present invention.

As illustrated in FIG. 8, an image sensor may include: circuitry (not shown) in which a first lower interconnection (not shown) and second lower interconnection 110 may be formed on and/or in dielectric 120 of substrate 100; a first lower electrode (not shown) on the first lower interconnection (not shown); a photodiode (not shown) on the first lower electrode (not shown); an upper electrode (not shown) on the photodiode; second lower electrode 140 having a passivation layer on second lower interconnection 110; and upper interconnection 175 on second lower electrode 140, upper interconnection 175 being electrically connected to the upper electrode.

The passivation layer may be a polymer passivation layer 155 formed on a side of second lower electrode 140.

In a method for manufacturing an image sensor in accordance with embodiments of the present invention, since the second lower electrode may be protected by a protective insulating layer and a polymer passivation layer, the second lower electrode, for example, profile of a Cr cathode, can be maintained. Thus, a contamination problem generated during a wet process can be solved or mitigated, processing time can be significantly reduced, and thickness of Cr can be maintained, thereby improving electrical characteristics.

Furthermore, the size of Cr can be controlled according to a predetermined or desired design rule by preventing loss of Cr in an oxygen plasma ashing process after etching of Cr. Moreover, due to the protection of Cr and prevention of loss, circuit direction of the cathode can be freely modified, and margin in manufacturing the circuit of a device can be significantly increased.

Hereinafter, an exemplary method for manufacturing an image sensor in accordance with further embodiments of the present invention will be described with reference to FIGS. 9 and 10.

Figure 9:
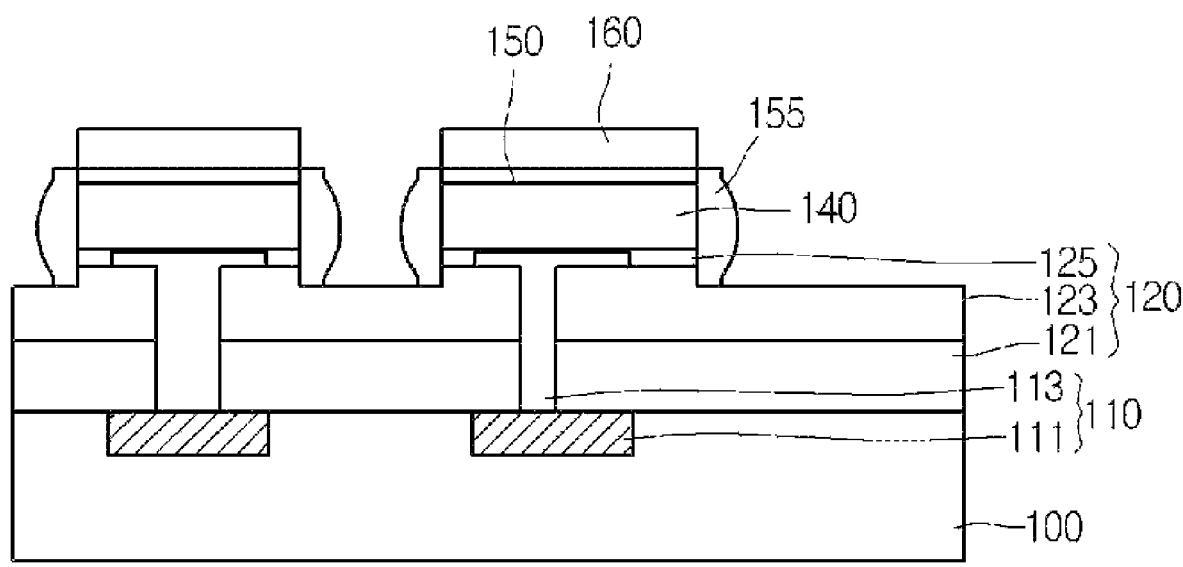
Figure 10:
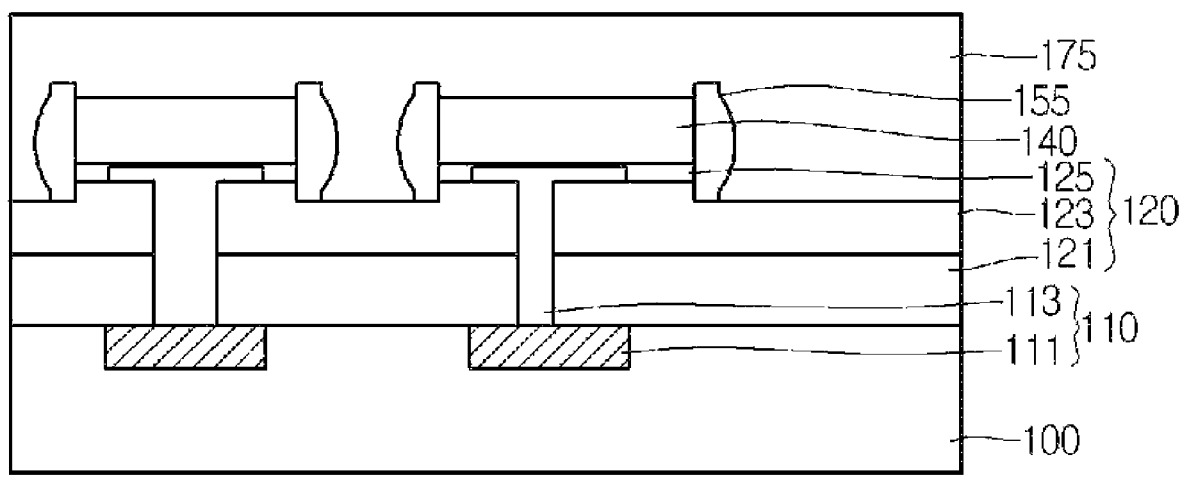

A method for manufacturing an image sensor in accordance with embodiments of the present invention illustrated in FIGS. 9 and 10 can employ technical features of embodiments of the present invention illustrated in FIGS. 1A and 1B. For example, the processes of FIGS. 2 to 5 can be employed.

For example, as illustrated in FIG. 2, metal layer 140a for the lower electrode may be formed on substrate 100 including second lower interconnection 110. Next, protective insulating layer 150 may be formed on metal layer 140a for the lower electrode.

After that, as illustrated in FIG. 3, mask pattern 160 for the lower electrode may be formed on protective insulation layer 150. Then, as illustrated in FIG. 4, protective insulating layer 150 may be selectively etched using mask pattern 160 for the lower electrode as a mask to leave protective insulating layer 150 on second lower interconnection 110. As illustrated in example FIG. 5, metal layer 140a for the lower electrode may be etched using mask pattern 160 for the lower electrode as a mask to form second lower electrode 140.

After that, as illustrated in FIG. 9, dielectric 120 of the substrate may be selectively etched using mask pattern 160 for the lower electrode as a mask, thereby forming polymer passivation layer 155 on the side of second lower electrode 140.

During the process of etching a lower interlayer dielectric (IMD) after the etching of Cr, etching may be performed using an etching process which generates a relatively large amount of an oxide polymer by using gas having high reactivity with IMD material. The generated polymer may be etched to form polymer passivation layer 155 which may serve to protect sidewalls of Cr.

Conditions for forming polymer passivation layer 155 on the side of second lower electrode 140 may be as follows.

Power (Source or High frequency) may be about 1,200 W±30%. If the power is too high, an amount of polymer may be too small. If the power is too low, the etch rate (E/R) may be lowered and thus the throughput or production of product may be insufficient.

Regarding kinds of the gas, polymer generation gas containing $CH_2F_2$, $CHF_3$, $C_5F_8$ or the like may be used, and an average rate may be 15 sccm±30% regardless of the kind(s) of gas. If the gas amount is too high, an etch stop may be caused by excessive polymer generation. If the gas amount is too low, polymer generation may be small and thus there may be no effect of the passivation layer.

Pressure may be higher than about 20 mtorr. If the pressure is less than 20 mtorr, too small an amount of polymer may be generated. If the pressure is too high, reactive ion etch (RIE) uniformity may be poor.

Next, as illustrated in FIG. 10, mask pattern 160 for the lower electrode may be removed using polymer passivation layer 155 to expose protective insulating layer 150. PR can be removed using an $O_2$ plasma ashing process.

According to embodiments of the present invention illustrated in FIGS. 9 and 10, since second lower electrode 140 may be protected by protective insulating layer 150 and polymer passivation layer 155, the second lower electrode, for example, profile of the Cr cathode, can be maintained. Thus, a contamination problem generated during the wet process can be solved or mitigated, processing time can be significantly reduced, and thickness of Cr can be maintained, thereby improving electrical characteristics.

Thereafter, exposed protective insulating layer 150 may be removed to expose a top surface of second lower electrode 140. Protective insulating layer 150 can be removed by an etch-back process, but is not limited thereto.

After that, upper interconnection 175, which may be electrically connected to the upper electrode, can be formed on second lower electrode. Upper interconnection 175 may be formed of dark metal to prevent light from being transmitted to the logic region. Upper interconnection 175 can electrically contact the top surface of second lower electrode 140.

Although embodiments of the present invention described above relate generally to a complementary metal oxide semiconductor (CMOS) image sensor, such embodiments are not limited to the same and may be readily applied to any image sensor requiring a photodiode.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments of the present invention have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    circuitry including a first lower interconnection and a second lower interconnection on and/or in a dielectric on a substrate;
    a plurality of first lower electrodes, a photodiode, and an upper electrode over the first lower interconnection in a pixel area;
    a plurality of second lower electrodes, each including a protective insulating layer thereon, in a logic area; and
    an upper interconnection over each of the protective insulating layers, the upper interconnection being in contact with sides of adjacent second lower electrodes.

2. The image sensor of claim 1, wherein the upper interconnection is electrically connected to the upper electrode.

3. The image sensor of claim 1, wherein each of the second lower electrodes comprise Cr.

4. The image sensor of claim 1, wherein the protective insulating layer comprises an oxide layer.

5. The image sensor of claim 4, wherein the oxide layer has a thickness of about 550 to about 1500 Å.

6. The image sensor of claim 1, wherein the protective insulating layer is over the second lower interconnection.

7. The image sensor of claim 1, wherein the plurality of first lower electrodes each comprises Cr.

8. The image sensor of claim 1, wherein the second lower interconnection comprises a top metal and a plug.

9. The image sensor of claim 1, wherein the top metal is on or in the substrate, and the plug is on or in a first dielectric, a second dielectric and a third dielectric.

10. The image sensor of claim 1, wherein the upper electrode comprises indium tin oxide (ITO) or cadmium tin oxide (CTO).

11. An image sensor comprising:
    circuitry including a first lower interconnection and a second lower interconnection on and/or in a dielectric on a substrate;
    a plurality of first lower electrodes, a photodiode, and an upper electrode over the first lower interconnection in a pixel area;
    a plurality of second lower electrodes, each including a protective insulating layer on sides of the corresponding second lower electrodes, in a logic area; and
    an upper interconnection over the plurality of second lower electrodes and the protective insulating layers, the upper interconnection having a continuous portion in direct contact with a top surface of adjacent second lower electrodes.

12. The image sensor of claim 11, wherein the upper interconnection is electrically connected to the upper electrode.

13. The image sensor of claim 11, wherein the second lower electrode comprises Cr.

14. The image sensor of claim 11, wherein the protective insulating layer comprises an oxide layer.

15. The image sensor of claim 11, further comprising a polymer passivation layer on sides of each of the second lower electrodes.

16. The image sensor of claim 11, wherein the plurality of first lower electrodes each comprises Cr.

17. The image sensor of claim 11, wherein the second lower interconnection comprises a top metal and a plug.

18. The image sensor of claim 11, wherein the top metal is on or in the substrate, and the plug is on or in a first dielectric, a second dielectric and a third dielectric.

19. The image sensor of claim 11, wherein the upper electrode comprises indium tin oxide (ITO) or cadmium tin oxide (CTO).

* * * * *